Figure 1:
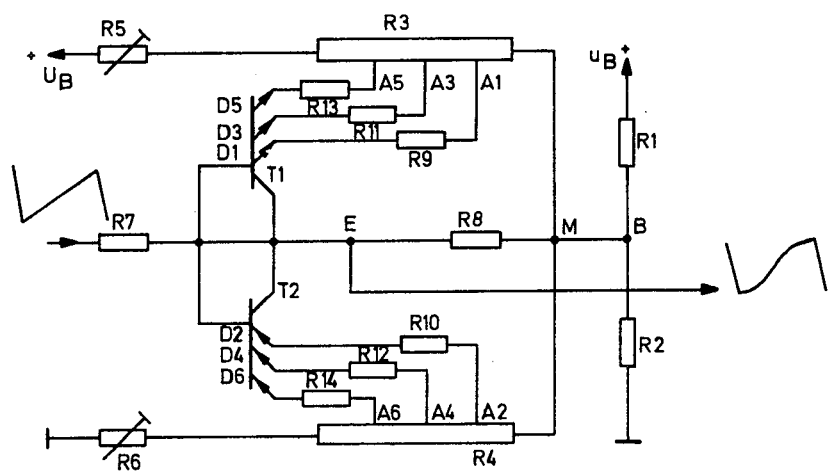

United States Patent [19]

Schat et al.

[11] 4,031,411

[45] June 21, 1977

[54] MONOLITHIC INTEGRATED CIRCUIT FOR THE DISTORTION OF A SAW-TOOTH SIGNAL

[75] Inventors: Hermannus Schat, Freiburg; Laurin Clemens Freyberger, Endingen, both of Germany

[73] Assignee: ITT Industries, Inc., New York, N.Y.

[22] Filed: Aug. 4, 1975

[21] Appl. No.: 601,759

[30] Foreign Application Priority Data

Aug. 16, 1974 Germany .......................... 2439343

[52] U.S. Cl. .......................... 307/228; 307/299 A; 307/254; 315/364

[51] Int. Cl.² ...................................... H03K 17/00

[58] Field of Search ........... 328/181, 187; 315/185, 315/402; 307/228, 299 A

[56] References Cited

UNITED STATES PATENTS

| 2,966,624 | 12/1960 | Dietrich | 328/181 |
|---|---|---|---|
| 3,440,484 | 4/1969 | Truskala | 315/402 |
| 3,748,531 | 7/1973 | Boekhorst et al. | 315/402 |

*Primary Examiner*—Stanley D. Miller, Jr.
*Assistant Examiner*—B. P. Davis
*Attorney, Agent, or Firm*—John T. O'Halloran; Peter C. Van Der Sluys; Vincent B. Ingrassia

[57] ABSTRACT

Several solutions to the problem of making integrable the known so-called tangent correction circuit of TV receivers are provided. The solutions are: a diode-resistor matrix, a voltage-dependent resistor arrangement or a regulating circuit.

6 Claims, 5 Drawing Figures

MONOLITHIC INTEGRATED CIRCUIT FOR THE DISTORTION OF A SAW-TOOTH SIGNAL

For effecting the vertical deflection of the beam current in television picture tubes, a saw-tooth vertical deflecting current is sent through the vertical deflecting coils. This saw-tooth current, for the purpose of correcting the deflecting error caused by the flattened screen of the picture tube, must be subjected to a tangent distortion. In customary types of vertical deflecting circuits composed of individual components, RC-networks are used to this end. The capacitance and resistance values of the components required therefor, however, are such that they, for the well-known reasons (excessive surface requirement), are unsuitable for monolithic integration. The problem of distorting a linear saw-tooth signal also arises in convergence circuits used in colour television receivers and, in addition thereto, quite generally in the fields of electronics.

Figure 2:
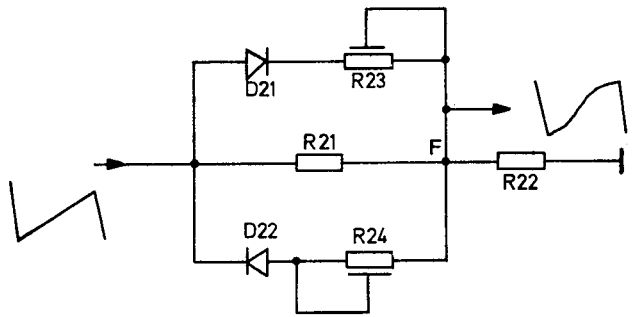
Figure 3:
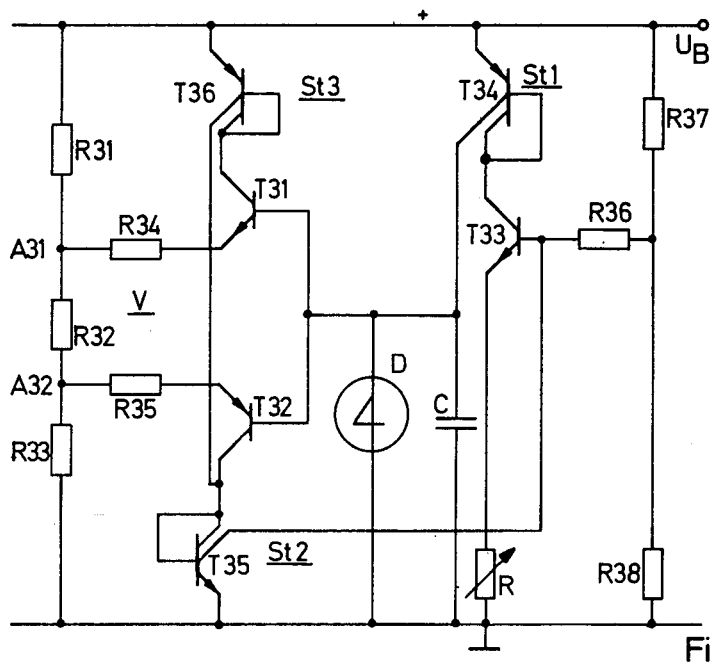
Figure 4:
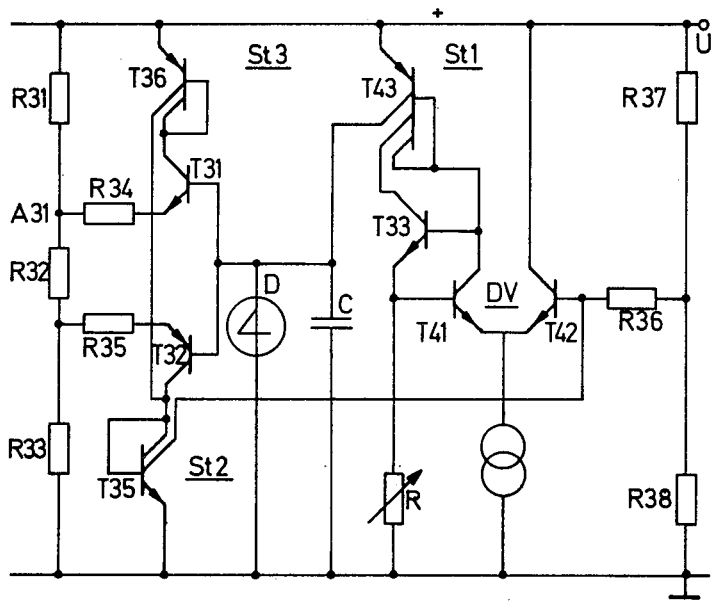
Figure 5:
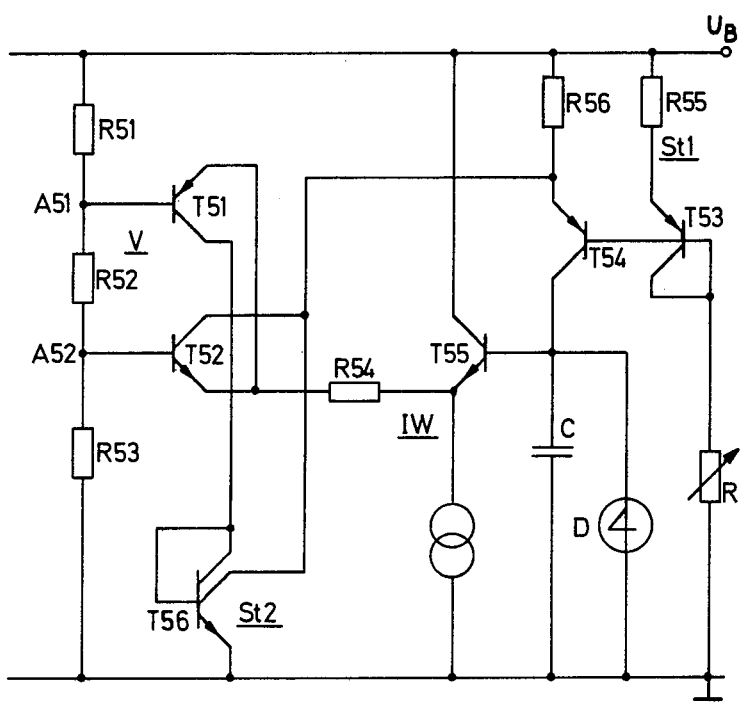

The object of the invention, relating in general to a monolithic integrated circuit for the distortion of a linear saw-tooth signal, more particularly for the tangent correction of the saw-tooth vertical deflecting current in television picture tubes, which is generated by the charging of a capacitor, therefore, is to provide circuits containing no RC-networks for the distortion, in particular for the tangent correction and, accordingly, can be monolithically integrated. This object is achieved by the invention as set forth in claim 1. Particularly advantageous embodiments and further developments of the invention are characterized in the subclaims and will be described in detail together with the invention and with reference to FIGS. 1 to 5 of the accompanying drawings, in which:

FIG. 1 shows an example of embodiment of a first solution to the problem on which the invention is based, FIG. 2 shows the circuit diagram of an example of embodiment of a second solution to the problem on which the invention is based, FIG. 3 shows a first example of embodiment of a third solution to the problem on which the invention is based, FIG. 4 shows a further development of an example of embodiment according to FIG. 3, and FIG. 5 shows a second example of embodiment of the third solution to the problem on which the invention is based.

The example of embodiment of a first possibility of solving the problem according to the invention as shown in FIG. 1 represents in its entirety, a voltage-dependent resistor which is connected in series with the output of the saw-tooth generator towards a constant potential, namely within the output of the first voltage-divider consisting of the resistors R1, R2 applied to the tap B via the supply voltage.

The voltage-dependent resistor arrangement consists of a resistor-diode-matrix, containing two further voltage dividers, namely the second voltage divider including the resistors, R3, R4, R5, R6, and the third voltage divider containing the resistors R7, R8. The resistors of the second voltage divider extend in the order R5, R3, R4, R6, from the voltage-conducting pole + of the source of supply voltage $U_B$ to the zero point of the circuit. The center point M of the second voltage divider constituted by the point connecting the resistors R3, R4, is applied to the tap B of the first voltage divider R1, R2, and to the low point of the third voltage divider R7, R8, i.e. the resistors R1, R2, R3, R8 are on one side all connected to one another.

The resistors R3, R4 each comprise the same number of taps, i.e. these themselves are again designed as voltage dividers. Taps of the same potential of these voltage dividers, hence in FIG. 1 the taps A1, A2 or A3, A4 or A5, A6 are each connected to a diode and each across one resistor, with the other terminal of the respective diode extending to the tap E of the third voltage divider R7, R8.

In particular, the tap A1 is applied across the resistor R9, to the diode D1, the tap A3 is applied across the resistor R11 to the diode D3, the tap A5 is applied across the resistor R13 to the diode D5, the tap A2 is applied across the resistor R10 to the diode D2, the tap A4 is applied across the resistor R12 to the diode D4, and the tap A6 is applied across the resistor R14 to the diode D6. As diodes there are used in the example of embodiment according to FIG. 1, two multiple-emitter transistors T1, T2 which are complementary in relation to one another, with the base electrodes thereof being respectively connected to the collectors thereof, with these two electrodes being applied to the tap E of the third voltage divider R7, R8. The respective emitter-base-pn-junctions serve as the diodes D1 to D6.

The uncorrected output signal of the saw-tooth generator, hence e.g. the voltage at the capacitor not shown in FIG. 1, is coupled to the top end of the third voltage divider R7, R8 while the tangent-corrected signal is taken off the tap E of this voltage divider as is indicated by the shape of curve shown in FIG. 1.

By the resistors R5, R6 shown as the variable resistors in FIG. 1, of the second voltage divider, the intended shape of curve of the tangent-corrected saw-tooth beam can be adjusted, hence if so required, it is possible, for example, to adjust the symmetry thereof with respect to the center point of the saw-tooth characteristic. Likewise, by shifting or displacing the taps A1 to A6 at the resistors R3, R4, it is possible to adjust the shape of curve of the corrected signal.

The diodes D1 to D6, with respect to the potential applied to the tap B of the first voltage divider R1, R2, are polarised in the reverse direction, i.e. in the case of the polarity of the supply voltage $U_B$ chosen in the example of embodiment according to FIG. 1, with a voltage-conducting pole which is positive with respect to the zero point of the circuit, the multiple-emitter transistor T1 is of the npn-conductivity type, and the multiple-emitter transistor T2 is of the pnp-conductivity type.

By the individual diodes D1 to D6, in dependence upon the momentary amplitude of the saw-tooth signal to be corrected, the resistors R9 to R14 in series with the resistor R8, are connected in parallel with the corresponding partial resistances of the resistors R3, R4, so that there will result the effect of a voltage divider having a variable division ratio.

The example of embodiment shown in FIG. 2 relating to the second principle of solution according to the invention, consists of a voltage divider arranged in parallel with the output of the saw-tooth generator, hence e.g. to the output of the capacitor charged by the constant current, with this capacitor likewise not being shown for reasons of clarity, in FIG. 2. This voltage divider consists of the resistors R21, R22, with two series arrangements each consisting of a diode D21, D22 and of a pinch resistor or a field-effect resistor R23, R24 being connected in parallel to the resistor R21.

In the case of monolithic integrated bipolar circuits, a pinch resistor is realized in that into a region produced by the base diffusion of the manufactured transistors, and intended to serve as a diffused resistor, there is inserted a zone of opposite conductivity produced by the emitter diffusion of the transistors, from the surface, thus reducing the thickness thereof, so that the specific resistance is considerably increased with respect to the resistance of the non-pinched "base region". Field-effect resistors are as a rule field-effect transistors whose gate electrode terminal is connected to the drain terminal.

The polarities of the diodes D21, D22 as arranged in the series connections, are in opposition to one another, i.e. at the input of the voltage-dependent parallel resistor there are arranged the anode of the diode D21 and the cathode of the diode D22. The corrected saw-tooth signal is taken off the tap F of the voltage divider R21, R22.

Instead of the non-linear resistors according to FIGS. 1 and 2, it is also possible to use non-linear amplifiers, with the term "amplifier" being meant to imply a four-terminal network having a gain factor greater or smaller than one (unity).

FIG. 3 shows a first example of embodiment of a further principle for solving the problem underlying the invention. In this example, the voltage as appearing at the capacitor C of the saw-tooth generator, is fed to a voltage comparator V whose output current or a current equal or in proportion thereto, serves to control the base of the coupling transistor T33, with the collector current thereof being linked to the charging current of the capacitor via the first current transformation circuit St1. Accordingly, the arrangement of FIG. 3 represents a regulating circuit which is closed in itself, effecting a tangent correction in that the charging current of the capacitor is varied in dependence upon the momentary amplitude of the capacitor voltage.

In FIG. 3 the saw-tooth generator consists of the capacitor C with the threshold element arranged in parallel therewith, which is fixed upon reaching a certain capacitor voltage, for discharging the latter within a short period of time. In FIG. 3, as a suitable switching element for this purpose, there is shown the four-layer diode D. It is also possible, however, to use any other suitable electronic circuit in place thereof.

Charging of the capacitor C is effected via the output current of the first current transformer circuit St1 which is taken off the collector of the double-collector transistor T34, i.e. this collector is connected to a terminal of the capacitor C not facing the zero point of the circuit.

The second collector of the double-collector type transistor T34 is connected to the base thereof and, via the collector-emitter path of the coupling transistor T33, extends to the adjustable resistor R whose terminal which is not connected to the emitter, is applied to the zero point of the circuit. Across this resistor R it is possible to influence the frequency and the slope of the saw-tooth signal, because this resistor, via the emitter-collector path of the coupling transistor T33, is in connection with the control input of the first current transformer circuit St1.

Current transformer circuits of the type as shown are customarily used in monolithic integrated circuits. Their characteristic property resides in that the input current and the output current are in a constant relationship with respect to one another and which, as a rule, is adjusted by the surface dimensions of the collector zones. One special case of such current transformer circuits is the so-called current mirror circuit (cf. e.g. the German technical journal "Funktechnik", 1973, pp. 313 and 314) in which the relationship between the input and the output current equals unity (1).

The voltage comparator circuit V consists in FIG. 3 of the two complementary transistors T31, T32 of which the transistor T31 in the case of the polarity of the supply voltage source $U_B$ as assumed in FIG. 3, with the negative pole thereof at the zero point of the circuit, is a transistor having an npn-type conductivity, and the transistor T32 is a transistor of pnp-type conductivity. The base electrodes of the two transistors T31, T32 are applied in common to the terminal of the capacitor C not facing the zero point of the circuit. The two emitters each extend via one series resistor R34, R35, to the two taps A31, A32 of the voltage divider lying across the supply voltage $U_B$, to the resistors R31, R32, R33. As will be seen, the point connecting the resistor R31 as applied to the voltage-conducting pole + of the source of the supply voltage $U_B$, to the center resistor R32, forms the tap A31, while the tap A32 is constituted by the point connecting the resistor R33 as applied to the zero point of the circuit, to the center resistor R32. The collector of transistor T32 is connected to the control input of the second current transformer circuit St2, and the collector of transistor T31 is connected to the control input of the third current transformer circuit St3. The output of the third current transformer circuit St3 is likewise applied to the input of the second current transformer circuit St2, hence also to the collector of the transistor T32.

The output of the second current transformer circuit St2 serves to control the base of the coupling transistor T33 which, across the series resistor R36, is connected to the tap of the voltage divider lying across the supplying voltage $U_B$, comprising the resistors R37, R38.

As the second and the third current transformer circuit St2, St3 there are used the double-collector transistors T35, T36 which are connected in the same way as the double-collector transistor T34 of the first current transformer circuit St1, i.e. the one collector is connected to the base electrode and forms the control input, while the other collector forms the output. The conductivity type of the double-collector transistors T34, T36 is complementary to that of the double-collector transistor T35, i.e. in the case of the polarities as chosen in FIG. 3, both the double-collector transistors T34, T36 are of the pnp-conductivity type, while the double-collector transistor T35 is of the npn-conductivity type. This way of realizing current transformer circuits by means of transistors which are complementary in relation to one another, is of general validity, i.e. on the side of the positive potential there are to be used transistors of the pnp-conductivity type, and on the side of the zero point of the circuit or of negative potential, there are to be used transistors of the npn-conductivity type, with mostly so-called lateral transistors being used in the case of pnp-transistors, although it will also be possible to use so-called substrate-pnp-transistors for the same purpose.

In dependence upon the momentary amplitude of the capacitor voltage and the constant potentials at the taps A31, A32, the transistors T31, T32 are controlled into a more or less conducting state, thus generating via the current transformer circuits St2, St3 a current which is either added to or substracted from the current flowing as the charging current of the capacitor from the first current transformer circuit St1.

FIG. 4 shows a further development of the example of embodiment according to FIG. 3, representing an improvement in or relating to the arrangement according to FIG. 3, in so far as the threshold offset voltage in FIG. 4 which is due to the coupling transistor T33, is compensated by means of the differential amplifier DV. To this end, the first current transformer circuit St1 consists of the triple-collector transistor T43, the first collector of which is connected to the terminal of the capacitor C not facing the zero point of the circuit, with the second collector thereof being connected to the collector of the coupling transistor T33, and the third collector thereof being connected to a base electrode thereof, with this terminal, on one hand, extending to the collector of the one differential amplifier transistor T41 and, on the other hand, to the base of the coupling transistor T33. The base of the differential transistor amplifier T41 is applied to the emitter of the coupling transistor T33. The collector of the other differential amplifier transistor T42 is applied to the voltage-conducting pole + of the source of supply voltage $U_B$, i.e. the differential amplifier DV is a so-called asymmetrical differential amplifier.

The base of the differential amplifier transistor T42 is applied via the series resistor R36 to the top of the voltage divider R37, R38 and to the output of the second current transformer circuit St2, hence functionally the differential amplifier DV is arranged between the base of the coupling transistor T33 and the output of the second current transformer circuit St2. Finally, the emitters of the two differential transistor amplifiers T41, T42 are connected to the zero point of the circuit via a constant current source. In the example of embodiment according to FIG. 4 with the minus pole of the source of supply voltage $U_B$ lying at the zero point of the circuit, the two differential transistor amplifiers T41, T42 are transistors of the npn-conductivity type. The remaining circuit elements shown in FIG. 4 correspond to those of the example of embodiment according to FIG. 3 and, accordingly, are indicated by the same references.

In FIG. 5, finally, there is shown a second example of embodiment relating to a regulating circuit according to the invention serving the tangent correction. The saw-tooth generator again consists of the capacitor C with the threshold element D arranged in parallel therewith. The current transformer circuit St1 serving the charging thereof, consists in FIG. 5 of the two transistors T53, T54 whose base electrodes are connected to one another. The collector of transistor T54 is connected to the capacitor C while its emitter, across the resistor R56 is connected to the voltage-conducting pole + of the source of supply voltage $U_B$. The emitter of transistor T53, across the resistor R55, is likewise applied to the voltage-conducting pole +, while the base thereof is connected to its collector and, across the variable resistor R, is applied to the zero point of the circuit.

In the example of embodiment shown in FIG. 5, the voltage comparator V consists of the two complementary transistors T51, T52, with the two base electrodes thereof being connected to the two taps A51, A52 of the voltage divider as lying across the source of supply voltage, and comprising the three resistors R51, R52, R53. Accordingly, this voltage divider may be compared with the corresponding voltage dividers as shown in FIGS. 3 and 4. Similar as in the case thereof, the tap A51 is formed as a point connecting the resistor R51 as applied to the voltage-conducting pole + of the source of supply voltage, to the center resistor R52, and the tap A51 constitutes the point connecting the resistor R53 as applied to the zero point of the circuit, to the resistor R52 which is the center one of the voltage-dividing resistors.

The emitters of the two complementary transistors T51, T52 are connected to one another and, across the series resistors R54, are applied to the output of the impedance transformer IW as constituted by the transistor T55, with the output thereof, hence the base of transistor T55, being connected to the terminal of the capacitor C not facing the zero point of the circuit, while the collector of transistor T55 is applied to the voltage-conducting pole + of the source of supply voltage $U_B$.

The collector of transistor T51 is connected to the control input of the second current transformer circuit S', hence to that collector of the double-collector transistor T56 which is connected to its base, while the collector of transistor T52, together with the output of the second current transformer circuit S', hence the second collector of the double-collector transistor T56, is connected to the emitter of transistor T54 of the first current transformer circuit St1.

In this example of embodiment, likewise in dependence upon the momentary amplitude of the capacitor voltage and the firmly adjusted potentials at the taps A51, A52, via a voltage comparator V, an additional current is either added to or subtracted from the actually constant charging current of the capacitor C.

The advantage of the tangent correction circuits according to the invention is to be seen in that they are monolithically integrable and thus, without further ado, capable of being included as partial circuits in more voluminous integrated circuits for television receivers, hence, for example, the vertical deflection circuits. The employment of the described principle of the invention, however, is not restricted to vertical deflection circuits, in fact, the invention can be used in all cases where a linear saw-tooth signal has to be subjected to a corresponding deformation.

What is claimed is:
1. A monolithic integrated circuit for distorting a linear saw-tooth signal without using RC-networks, preferably for the tangent correction of the saw-tooth shaped vertical deflecting current of television picture tubes, which saw-tooth is generated by the charging of a capacitor, comprising:
   a regulating circuit which influences the charging current of said capacitor in dependence upon the amplitude of the saw-tooth generator output signal, said regulating circuit comprising:
   a voltage comparator (V) having applied thereto the capacitor voltage;
   a coupling transistor (T33) having a base electrode coupled to the output of said voltage comparator; an emitter electrode coupled to a reference and
   a first current transformer (St1), the collector current of said coupling transistor being coupled to the charging current of said capacitor via said first current transformer.

2. A circuit according to claim 1, wherein the voltage comparator (V) contains two complementary transistors (T31, T32), a second current transformer circuit (St2) applied to the zero point of the circuit, a third current transformer circuit (St3) applied to the voltage-conducting pole (+) of the source of supply voltage ($U_B$) and a voltage divider lying across the supply voltage, composed of at least two resistors (R31, R32, R33), to the tap (A31) of which as formed by the resistor (R31) as connected to the voltage-conducting pole of the source of supply voltage with the center resistor, and across a first series resistor (R34), there is connected the emitter of the one (T31) of the two complementary transistors, and to the tap (A32) of which, as composed of the resistor (R33) applied to the zero point of the circuit, across a second series resistor (R35), there is connected the emitter of the other (T32) of the two complementary transistors whose base electrode, together with the base electrode of the one transistor (T31) is connected to the terminal of the capacitor (C) not facing the zero point of the circuit, and with the collector thereof, on one hand, being connected to the control input of the second current transformer circuit (St2) and, on the other hand, to the output of the third current transformer circuit (St3), to the control input of which there is applied the collector of the one (T31) of the two complementary transistors, that moreover, the output of the first current transformer circuit (St1) is connected to the terminal of the capacitor (C) not facing the zero point of the circuit, and that the base electrode of the coupling transistor (T33) on one hand, across a third series resistor (R36), which is connected to the tap of a voltage divider comprising two resistors (R37, R38) lying across the supply voltage and, on the other hand, to the output of the second current transformer circuit (St2), while the emitter of the coupling tranistor (T33), across a frequency-determining resistor (R) is applied to the zero point of the circuit with the collector thereof being connected to the control input of the first current transformer circuit (St1)

3. A circuit according to claim 2, wherein the base of the coupling transistor (T33), together with the collector of the one (T41) of the two transistors (T41, T42) of an asymmetrial differential amplifier (DV) is connected to the control input of the first current transformer circuit (St1), that the base electrode of the one differential amplifier transistor (T41), together with the emitter of the coupling transistor (T33), across the frequency-determining resistor (R) is applied to the zero point of the circuit, with the collector thereof being applied to the first output of the first current transformer circuit (St1), that the base of the other differential amplifier transistor (T42), on one hand, across a third series resistor (R36), is applied to the tap of the voltage divider comprising two resistors (R37, R38) as lying across the source of supply voltage ($U_B$) and, on the other hand, to the output of the second current transformer circuit (St2), and that the collector of the other differential amplifier transistor (T42) is connected to the voltage-conducting pole (+) of the source of supply voltage ($U_B$).

4. A circuit according to claim 2, wherein the first, second and third current transformer circuits (St1, St2, St3) each consist of double-collector transistors (T34, T35, T36) in which the base electrode as connected to the one collector, serves as the control input, while the other collector serves as the output, and that the double-collector transistors (T34, T36) of the first and third current transformer circuits (St1, St3) are complementary to the double collector transistor (T35) of the second current transformer circuit (St2).

5. A circuit according to claim 3 wherein the first current transformer circuit (St1) consists of a triple-collector transistor (T43) and that the second and third current transformer circuits (St2, St3) each consist of double-collector transistors (T35, T36) in which the base connected to the one collector, serves as the control input, and the other collector, or also the third collector, serves as an output (outputs), and that the triple-collector transistor (T43) of the first, and the double-collector transistor (T36) of the third current transformer circuit are complementary to the double-collector transistor (T35) of the second current transformer circuit.

6. A circuit according to claim 5 wherein in the case of a tangent correction which is symmetrical up to the centre point of the saw-tooth-shaped vertical deflecting current, the third current transformer circuit is a current-mirror circuit.

* * * * *